United States Patent [19]

Grellmann et al.

[11] Patent Number: 5,109,177
[45] Date of Patent: Apr. 28, 1992

[54] DAMPED CRADLE FOR SAW DEVICE

[75] Inventors: H. Erwin Grellmann, Beaverton; Emmanuel Sang, Portland, both of Oreg.

[73] Assignee: Tektronix, Inc., Beaverton, Oreg.

[21] Appl. No.: 442,277

[22] Filed: Nov. 28, 1989

[51] Int. Cl.$^5$ .................................. H01L 41/08
[52] U.S. Cl. ........................................ 310/313 R
[58] Field of Search ............... 310/313 R, 348, 338, 310/339; 333/150, 193; 174/52.1, 52.5, 50.54

[56] References Cited

U.S. PATENT DOCUMENTS

| | | | |
|---|---|---|---|
| 1,619,854 | 2/1926 | Crossley | 310/348 |
| 1,766,036 | 4/1927 | Crossley | 310/348 |
| 1,882,885 | 4/1928 | Polkinghorn | 310/348 |
| 1,933,601 | 6/1929 | Scheibell | 310/348 |
| 2,029,359 | 6/1933 | Clapp | 310/348 |
| 2,044,145 | 9/1934 | Beard | 310/348 |
| 2,285,143 | 1/1940 | Bokovoy | 310/348 |
| 2,409,607 | 10/1943 | Bach | 310/348 |
| 2,412,438 | 10/1943 | Bach | 310/348 |
| 2,482,451 | 6/1945 | Adams | 310/348 |
| 3,885,173 | 5/1975 | Lee | 310/348 |
| 4,267,479 | 5/1981 | Kato | 310/348 |
| 4,618,797 | 10/1986 | Cline | 310/339 |
| 4,845,397 | 7/1989 | Herrick et al. | 310/313 R X |
| 4,859,898 | 8/1989 | Aubry et al. | 310/348 X |

OTHER PUBLICATIONS

Design & Manufacture of Saw Resonators for Low Phase Noise and Low Vibration Sensitivity Applications (Sang/Beckman/Snow/Wright) IEEE 1986, 0090-5607/86/0000-00245.

Sensitivity of Saw Delay Lines and Resonators to Vibration (Parker/Callerame) 1981 Ultrasonics Symposium-129; 1981 IEEE.

Primary Examiner—Mark O. Budd
Attorney, Agent, or Firm—Francis I. Gray

[57] ABSTRACT

A damped cradle for a pressure sensitive device is constructed in a unitary form. The cradle has a base that is attached to a substrate. Extending upward from the base are side arms with pairs of spring, or compliant, tips that contact the sides of the pressure sensitive device. Also extending upward from the base over the top of the pressure sensitive device are spring arms with compliant tips that contact the top surface of the pressure sensitive device in non-active areas. Vibrational forces in lateral (X-Y plane) directions are damped by friction between the bottom of the pressure sensitive device and the surface of the substrate, and vibration motion in the vertical, or Z, direction is stopped by enough spring force to overcome the maximum acceleration force the crystal mass encompasses for a given application. The spring forces of the spring tips and spring arms are balanced to produce a near zero pressure on the pressure sensitive device in both static and dynamic modes.

5 Claims, 1 Drawing Sheet

DAMPED CRADLE FOR SAW DEVICE

BACKGROUND OF THE INVENTION

The present invention relates to mounting apparatus for pressure sensitive components, and more particularly to a damped cradle suitable for mounting a piezoelectric surface acoustic wave (SAW) device on a substrate to provide increased vibration control with minimum induced stresses in the SAW device.

SAW devices are pressure sensitive crystals that are used widely in various applications, such as in oscillators and filters. The acoustic/mechanical properties of these devices are critical to their operation, and their physical attachment to a stable support may impact these acoustic/mechanical properties, and thus their operation. Stress related frequency drifts may occur in the SAW devices as a result of their physical attachment to the stable support from two sources. One is caused when large temperature excursions occur and materials having different thermal coefficients of expansion are in contact with the crystal. Another is caused by the physical contact of the support mechanism that produces pressure on the crystal, even when contact is in non-active areas of the crystal. Other mounting means, such as adhesives, may outgas under high vacuum conditions in a hermetically sealed package, contaminating the SAW device surface.

A prior attempt to provide a cradle that reduces the temperature and contact induced stresses on a SAW crystal is disclosed in U.S. Pat. No. 4,845,397 issued July 4, 1989 to Herrick et al entitled "Constraining Mount System for Surface Acoustic Wave Devices." This patent discloses a two-piece cradle that is attached to a substrate, the inner dimensions of which are slightly larger than the outer dimensions of the crystal. Flanges of the cradle overhang the crystal in non-active regions to prevent the crystal from being shaken out of the cradle under vibration, and spacers may be used to prevent appreciable movement within the cradle. However the movement of the crystal within the cradle under vibration is not appreciably damped by this construction.

What is desired is a cradle construction that may be used to mount a SAW device to a stable substrate with minimal induced stress while providing significant damping of motion in a vibration or shock environment.

SUMMARY OF THE INVENTION

Accordingly the present invention provides a damped cradle for a pressure sensitive device that is of unitary construction and provides minimal pressure, spring contact with non-active areas of the pressure sensitive device to provide friction damping of motion in a vibration or shock environment. The cradle has a base that is attached to the stable substrate by suitable means, integral side arms that have spring tips that lightly contact non-active side surfaces of the pressure sensitive device, and integral top spring arms with compliant tips that lightly contact non-active areas of the top surface of the pressure sensitive device. The surface contact of the device with the substrate is such as to provide a smooth transition from static to dynamic friction, with the light pressure of the top spring arms providing sufficient downward pressure to induce frictional movement of the device across the substrate surface to damp motion. Upward motion of the device is damped due to frictional movement between the device sides and the spring tips.

The objects, advantages and other characteristics of the present invention are apparent from the following detailed description when read in conjunction with the appended claims and attached drawing.

DESCRIPTION OF THE PREFERRED EMBODIMENT

Figure 1:
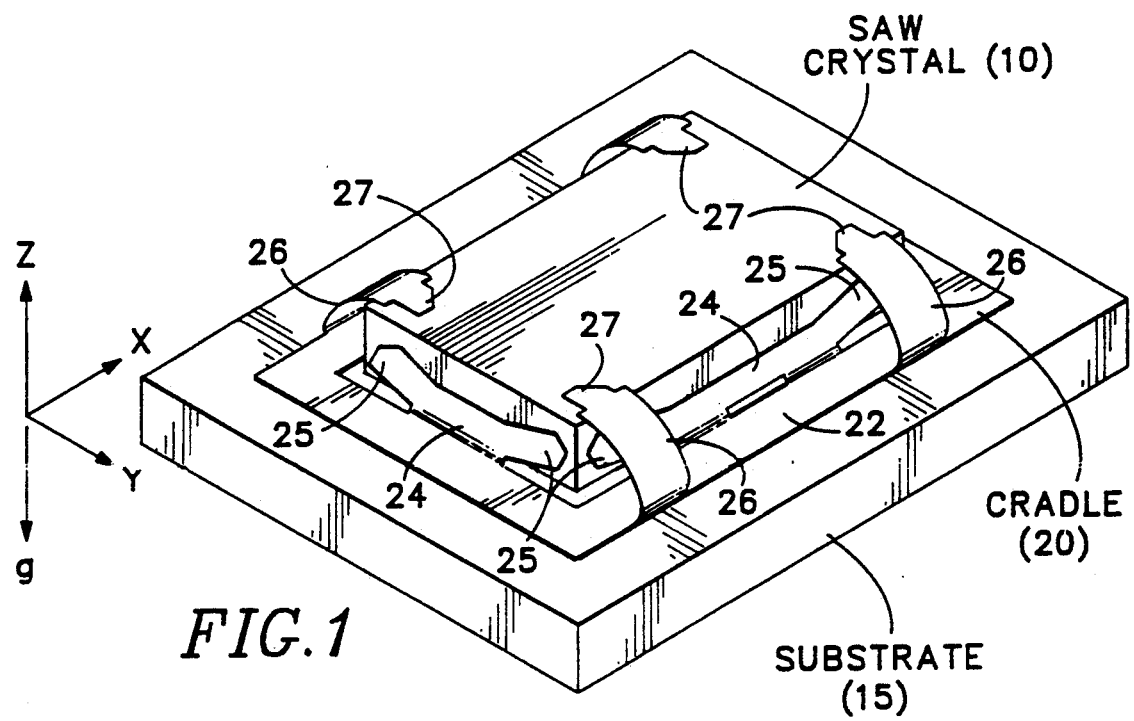
FIG. 1 is a perspective view of a pressure sensitive device mounted on a substrate using a damped cradle according to the present invention.
Figure 2:
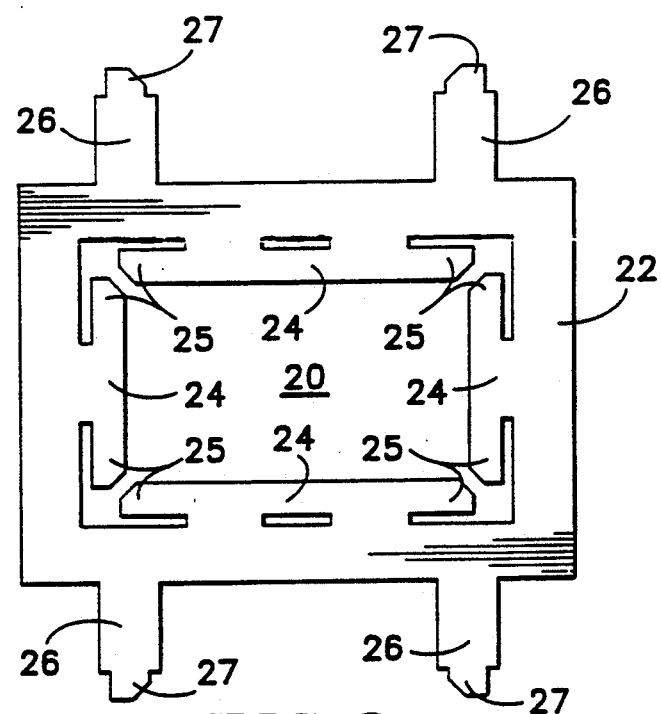
FIG. 2 is a top plan view of the damped cradle of FIG. 1 prior to shaping according to the present invention.

Referring now to FIG. 1 a pressure sensitive device, such as a SAW crystal 10, is mounted on a substrate 15. The crystal 10 is held on the substrate 15 by a cradle 20 that is fixedly attached to the substrate by any suitable means, such as welding, epoxy bonding, soldering or the like. The cradle 20 is a single, integral unit, as shown in FIG. 2, having a base portion 22 that is attached to the substrate. Extending upward from an internal edge of the base portion 22 are four restraining arms 24, one for each side of the crystal 10. Each restraining arm 24 has a pair of spring tips 25 that actually contact the sides of the crystal 10 with light pressure. Extending upward from an external edge of the base portion are four spring arms 26 that curve over the top edge of the crystal 10. At the end of each spring arm 26 is a compliant tip 27 that contacts the top surface of the crystal 10 at non-active areas with a light pressure.

The cradle 20 may be formed by any suitable technique, such as etching, to produce the configuration shown in FIG. 2. The material of the cradle is such as to provide a certain stiffness together with springiness, and to have a desired coefficient of friction to assist in frictional damping, such as beryllium-copper, stainless steel or the like. The side arms 24 are bent upward with the spring tips 25 bent inward. The spring arms 26 also are bent upward and back over the base portion 22 with the tips bent downward. The base portion 22 is attached to the substrate 15 and the crystal 10 is placed within the cradle 20. The spring tips 25 and compliant tips 27 are adjusted to contact the crystal 10 with a total pressure force that approaches zero to minimize the propagation of induced stresses throughout the crystal. Further the tips 25, 27 may be plated or otherwise treated to provide a desired friction damping to the crystal 10.

When lateral vibration acceleration forces are applied in the X and Y directions, the crystal 10 mass loads the opposing spring tips 25. The excursion of the crystal 10 under this vibration is greatly reduced by introducing damping in the form of dry friction to the spring loaded system. Damping is relative to the coefficient of friction, u, that is the ratio between the force, Fr, parallel to the substrate 15 induced by the vibrational forces and the sum loading, N, in the Z direction provided by tips 27, i.e., $u = Fr/N$. Damping chatter, which is related to the transition from dynamic to static friction, is reduced by the appropriate choice in materials and surface finish to produce a smooth transition. For example a polished quartz bottom surface for the crystal 10 contacting a smooth, soft gold surface plated on the substrate 15 is known to have minimum damping chatter. The compliant tips 27 in the Z axis provide enough force to overcome the maximum vibration acceleration forces the crystal 10 mass encompasses for a given application.

Thus the present invention provides a damped cradle for a SAW device with an improved vibration/shock isolation control on the order of one to two magnitudes better than prior art for hermetic packages without the use of organic materials. A one-piece cradle construction applies a balanced spring force to the SAW device at non-active areas and frictional damping reduces vibration effects on the SAW device.

What is claimed is:

1. A cradle for a pressure sensitive device comprising a unitary construction of a stiff, yet compliant material, having:
   a base portion for fixedly attaching to a substrate;
   a plurality of side protrusions extending upward from the base portion having tips to contact sides of the pressure sensitive device with minimum pressure; and
   a plurality of top protrusions extending upward from the base portion and over the pressure sensitive device to contact the pressure sensitive device having tips at non-active areas with minimum pressure, the total pressure on the pressure sensitive device being balanced to minimize propagation of induced stresses throughout the pressure sensitive device.

2. A cradle as recited in claim 1 wherein the compliant material comprises a material selected from the group consisting of beryllium-copper alloy and stainless steel.

3. A cradle as recited in claim 1 wherein the tips of the top and side protrusions are treated to provide a desired friction damping with the pressure sensitive device.

4. A package for a pressure sensitive device comprising:
   a substrate having the pressure sensitive device mounted thereon; and
   a cradle of a unitary construction fixedly attached to the substrate and restraining the pressure sensitive device, the cradle having a base portion that is fixedly attached to the substrate, a plurality of side protrusions extending upward from the base portion having tips to contact sides of the pressure sensitive device with minimum pressure, and a plurality of top protrusions extending upward from the base portion and over the pressure sensitive device having tips to contact the pressure sensitive device at non-active areas with minimum pressure, the total pressure on the pressure sensitive device being balanced to minimize propagation of induced stresses throughout the pressure sensitive device.

5. A package as recited in claim 4 wherein the materials and surface of the substrate and the pressure sensitive device at a point of contact between the substrate and the pressure sensitive device produces minimal damping chatter when lateral vibrational forces are applied to the pressure sensitive device, the vibration of the pressure sensitive device being frictionally damped as a result of the coefficient of friction at the point of contact.

* * * * *